United States Patent [19]
Kawamura

[11] Patent Number: 4,881,029
[45] Date of Patent: Nov. 14, 1989

[54] SEMICONDUCTOR INTEGRATED CIRCUIT DEVICES AND METHODS FOR TESTING SAME

[75] Inventor: Masahiko Kawamura, Yokohama, Japan

[73] Assignee: Kabushiki Kaisha Toshiba, Kawasaki, Japan

[21] Appl. No.: 911,739

[22] Filed: Sep. 26, 1986

[30] Foreign Application Priority Data

Sep. 30, 1985 [JP] Japan ................. 60-216513

[51] Int. Cl.⁴ ............... G01R 31/00; G01R 31/02
[52] U.S. Cl. ................ 324/158 R; 324/73 PC; 357/68; 29/827; 437/8
[58] Field of Search ........... 29/574, 825, 829, 831, 29/846, 827; 324/73 PC, 158 F, 158 R; 357/65, 66, 68; 361/414, 412; 437/8

[56] References Cited

U.S. PATENT DOCUMENTS

| 4,417,393 | 11/1983 | Becker | 29/864 |
| 4,587,549 | 5/1986 | Ushiku | 357/68 |
| 4,685,033 | 8/1987 | Inoue | 29/829 |

FOREIGN PATENT DOCUMENTS

| 0076161 | 4/1983 | European Pat. Off. | 29/574 |
| 0052372 | 4/1977 | Japan | 29/574 |
| 0108372 | 9/1978 | Japan | 29/574 |
| 0112058 | 9/1978 | Japan | 29/574 |
| 0078132 | 6/1981 | Japan | 29/574 |
| 0075438 | 5/1982 | Japan | 29/574 |
| 0085245 | 5/1982 | Japan | 29/574 |
| 0193041 | 11/1982 | Japan | 29/574 |
| 0116747 | 7/1983 | Japan | 29/574 |
| 60-187037 | 9/1985 | Japan | . |
| 60-206042 | 10/1985 | Japan | . |

OTHER PUBLICATIONS

"Multilayer Ceramic Fixed Layer Substrate Design", by Johnson et al., IBM Tech. Disc. Bull., vol. 22, #5, 10/79, pp. 1841-1842.
"Wirability Enhancement", by Jarvela et al., IBM Tech. Disc. Bull., vol. 21, #9, 2/79, p. 3624.
"Pin Attachment Structure for Multilayer Ceramic Substrates", by Kim, vol. 20, #11A, 4/78, p. 4333, IBM Tech. Disc. Bull.

Primary Examiner—Reinhard J. Eisenzopf
Assistant Examiner—W. Burns
Attorney, Agent, or Firm—Foley & Lardner, Schwartz, Jeffery, Schwaab, Mack, Blumenthal & Evans

[57] ABSTRACT

A semiconductor integrated circuit device, comprises a semiconductor integrated circuit chip having a plurality of signal wires and a plurality of test terminals connected to said signal wires. The test terminals are concentrated in at least one selected circuit area of the semiconductor integrated circuit chip to permit chip diagnosis using an image mode electron beam detector.

15 Claims, 5 Drawing Sheets

SEMICONDUCTOR INTEGRATED CIRCUIT DEVICES AND METHODS FOR TESTING SAME

BACKGROUND OF THE INVENTION

The present invention relates to semiconductor integrated circuit devices and methods for testing same, and especially relates to an improvement for electron beam (EB) test technology.

As one of the test means for semiconductor integrated circuit chip, EB testers are widely used. The EB tester is an apparatus for observing the state (such as presence of a disconnection or a short circuit) of a signal wire on the chip which depends on a detected output of reflected electrons or secondary electrons which are responsive to the local electric potential. Of several test mode, the image test mode is often employed. In the image test mode one observes the electric potentials of signal wires in a certain area of the chip at a certain time.

In practice, the use of the image mode test in an EB tester has the disadvantage that the area on the chip that can be tested at one time is limited to about 250 $\mu m \times 250$ $\mu m$ at most due to the large memory capacity required to store the image. Therefore, although the EB tester is useful for specified portions of the chip, it is not practical in the case of testing the entire chip, because of the enormous time and effort involved. Thus, it is difficult to judge the quality of chips only by using the EB tester.

SUMMARY OF THE INVENTION

Accordingly, an object of the present invention is to provide improved semiconductor integrated circuit devices for testing.

Another object of the present invention is to provide improved semiconductor integrated circuit devices that make it possible to perform EB testing with high efficiency.

Yet another object of the present invention is to provide improved methods for testing semiconductor integrated circuit devices.

In accomplishing the foregoing objects, there is provided, according to the invention a semiconductor integrated circuit device, comprising a semiconductor integrated circuit chip having a plurality of signal wires; and a plurality of test terminals drawn from said signal wires. The test terminals are concentrated in at least one selected circuit area of said semiconductor integrated circuit chip.

According to another object of the invention, there is provided a semiconductor integrated circuit device, comprising a semiconductor integrated circuit chip having a plurality of signal wires; and a plurality of electron beam test terminals drawn from the signal wires. The electron beam test terminals are concentrated in at least one selected area of the semiconductor integrated circuit chip.

According to another object of the invention, there is provided an improved method for testing semiconductor integrated circuit devices, comprising the steps of preparing a semiconductor integrated circuit chip having plurality of signal wires and a plurality of electron beam test terminals drawn from the signal wirings; and observing electrons from a selected area by irradiating the selected area with an electron beam. The electron beam test terminals are concentrated in at least the selected area of said semiconductor integrated circuit chip.

BRIEF DESCRIPTION OF THE DRAWINGS

The invention together with its various features and advantages, will be readily understood from the following more detailed description presented in conjunction with the following drawings, in which:

FIG. 4b is a sectional view along line A—A' of FIG. 4a;

DETAILED DESCRIPTION OF THE PREFERRED EMBODIMENTS

Figure 1:
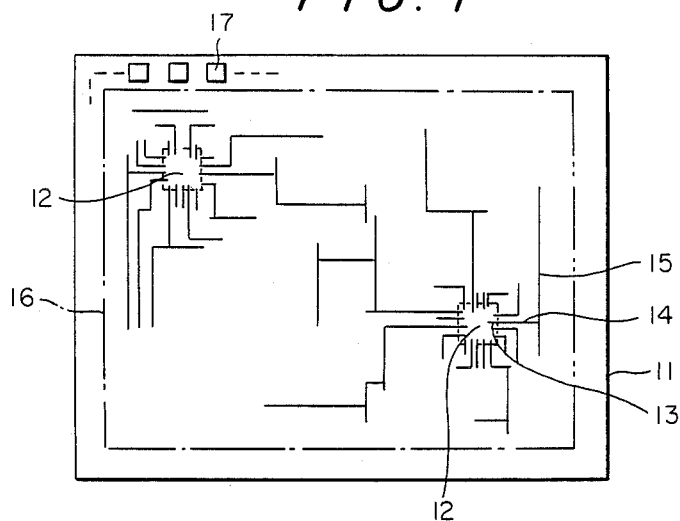
FIG. 1 is a diagram showing a plan view of a semiconductor integrated circuit chip in which the present invention is applied.

FIG. 1 is a diagram showing a plan view of a semiconductor integrated circuit chip in which the present invention is applied.

As shown in FIG. 1, in a semiconductor integrated circuit chip 11, one or more test areas 12 are arranged in which a number of test terminals 13 (electron beam test terminals) are concentrated.

The size of the test area 12, as described above, is a rectangular shape having a dimension on the order of, for example, 250 $\mu m \times 250$ $\mu m$ so as to permit observation of the entire test area 12 using the image test mode of EB tester. The test terminals 13 are formed by the ends of connection wires 14 which are themselves extensions of signal wires 15 that connect semiconductor elements such as MOSFETs with each other. The test area 12 is formed in a circuit area 16 of the chip 11, and around the circuit area 16, bonding pads 17 are formed.

Figure 2:
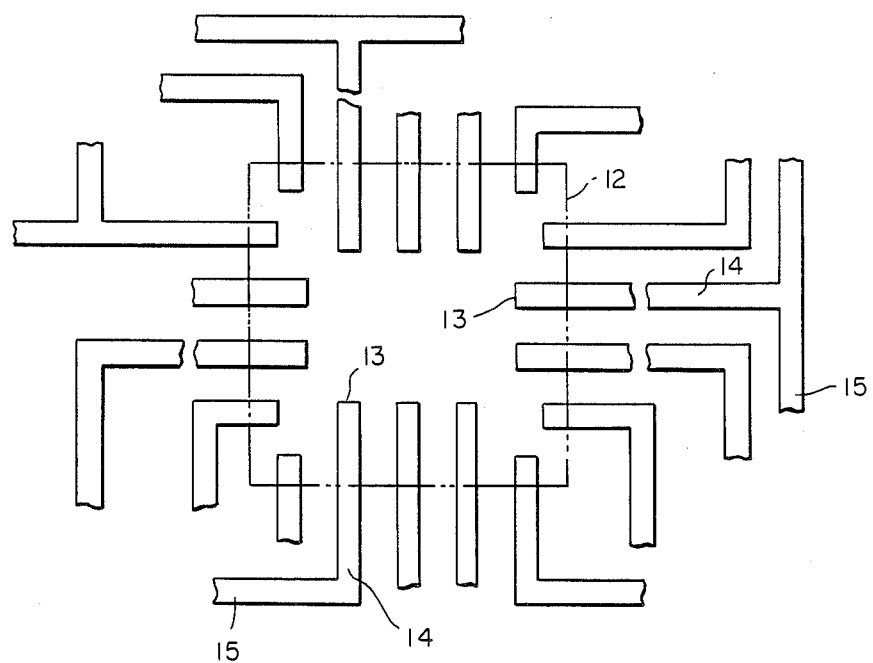
FIG. 2 is a diagram showing a plan view enlarging the test area and its surrounding region in FIG. 1.

FIG. 2 is a diagram showing the test area of FIG. 1 together with its surrounding region.

As shown in FIG. 2 the connection wires 14 diverge or extend from the signal wires 15 on the chip, and their ends are concentrated in the test area 12 to form the test terminals 13. The portion of the test terminals 13 existing in the test area 12 is defined as the electron beam test terminal. Not all of the signal wires 15 need be connected to the test terminals 13.

As shown in FIG. 2, for each group of test terminals 10 drawn from the four directions, the test terminals adjacent the corners of the test area 12 are shorter than the remaining test terminals.

The test terminals 13, connection wires 14 and signal wires 15 are made of metal such as Al. Some of the signal wires 15 connected to the connection wires 14 may be made from a lower conductive layer in the chip such as a lower Al or poly-si layer. In such a case, a contact hole is formed at their connecting position.

By concentrating a plurality of test terminals 13 within the relating small test area 12 (small as compared to the area of the whole chip) and by subsequently performing the image test mode of the EB tester against the test terminals 13 within the test area 12, a large number of electric states of the signal wires 15 may be determined for all test terminals at one time as, for example, the existence of abnormalities such as disconnections or short circuits, etc.

Figure 3:
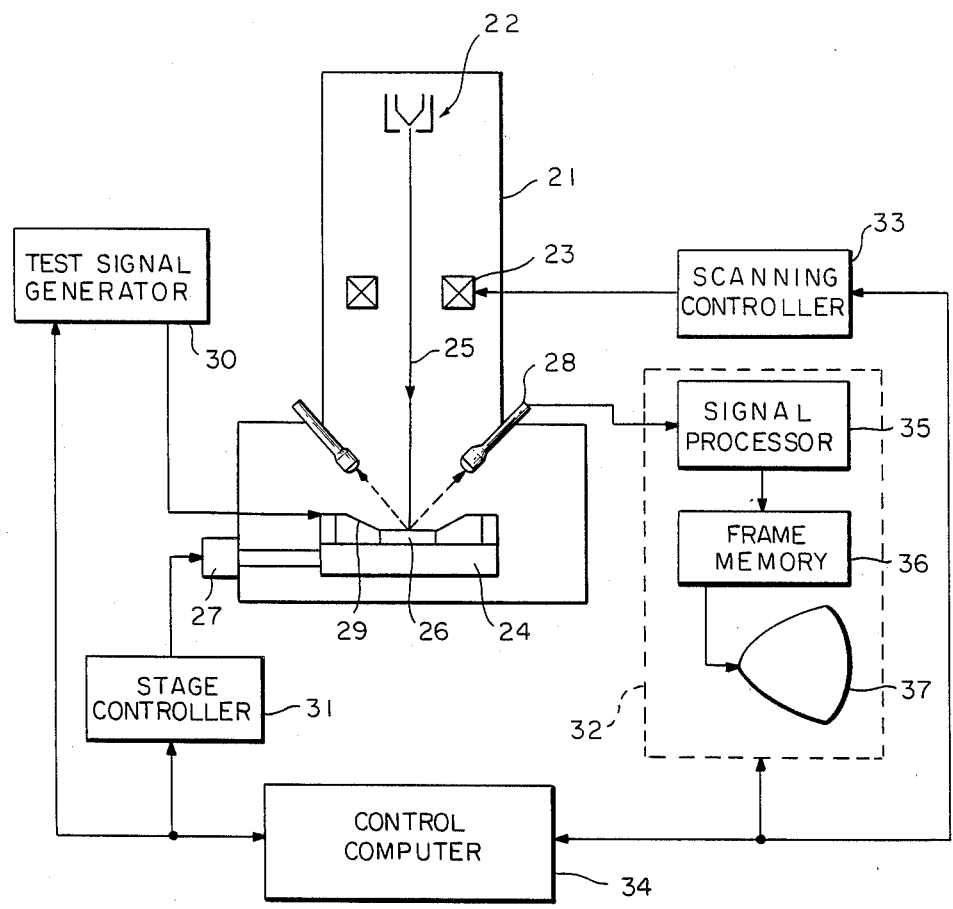
FIG. 3 is a diagram of EB tester for describing the usage of the semiconductor integrated circuit chip shown in FIG. 1 and FIG. 2.

FIG. 3 is a diagram of an EB tester which may be used with the semiconductor integrated circuit chip shown in FIG. 1 and FIG. 2.

As shown in FIG. 3, a vacuum chamber 21 is provided in which is housed an electron gun 22, an X—Y scanning coil 23 and an X—Y stage 24. Number 25 denotes an electron beam. The irradiated position of the chip 26 is raster-scanned with the scanning coil 23 after being positioned by the stage 24 via a motor 27. In the vacuum chamber 21, electron detectors 28 are attached to detect the secondary electrons from the chip 26. For each bonding pad of the chip 26, electrodes 29 are contacted for supplying test signals. The test signals may simple be fixed potential level as in FIG. 3 or alternately may be test signal pulses. FIG. 3 further shows a test signal generator 30, a stage controller 31, an image processing means 32, a scanning controller 33 and a control computer 34. The image processing means 32 comprises a signal processor 35, a frame memory 36 and a CRT display 37.

In the image test mode, the electron beam is scanned across the test area so that the electric potential distribution in the chip can be obtained as an image. In FIG. 3, the scanning coil 23 makes the electron beam 25 raster-scan the test area in the chip 26.

Secondary electrons from the test terminals are observed by the electron detectors 28 and are converted to electric potential contrast signals with the signal processor 35. These signals are then stored in the frame memory 36. After storing the contrast signals for the entire test area, the electric potential image is displayed on the display 37. The control computer 34 controls operations of the EB tester.

As described above, according to this embodiment of the invention, a number of test terminals are concentrated at one or more predetermined test areas on the chip. Hence in the case of the image test mode of the EB tester for testing signal wires, by testing only the relatively small number of test areas each having only a relatively small size, the states of an extremely large number of signal wires can be tested at once thereby greatly improving the efficiency of the EB tester. As a result, determination of chip quality that was difficult in the past becomes relatively easy to perform.

In this embodiment, an electron beam was scanned; however, scanning may be performed by moving the X—Y stage 24 instead of the electron beam scanning.

In the above embodiment, signal wires and connection wires use the highest or uppermost conductive layer, but a lower conductive layer may also be used.

Figure 4A:
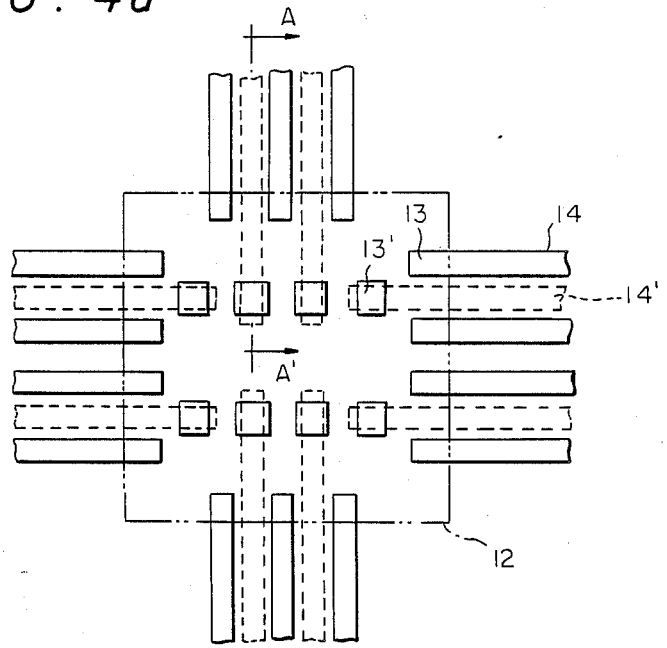
FIG. 4a is a diagram showing another embodiment of the invention and illustrates a plan view of the test area and its surroundings.
Figure 4B:
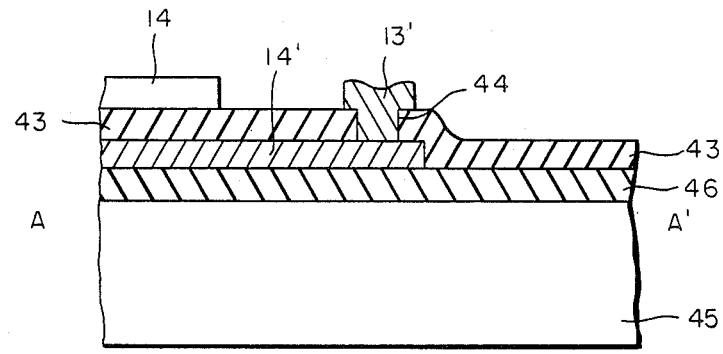

FIG. 4a is a diagram showing another embodiment of the invention and illustrates a plan view of the test area 12 and its surroundings as in FIG. 1. FIG. 4b is a sectional view along line A—A' of FIG. 4a.

In the embodiment of FIGS. 4a and 4b, connection wires 14 diverge or extend from the signal wires (not shown) of the highest conductive layer (in this embodiment, a higher Al layer) and connection wirings 14' diverge or extend from signal wires (not shown) of a lower conductive layer (in this embodiment, a lower Al layer). These connection wires 14 and 14' are concentrated together in the test area 12. The portions of connection wires 14 existing in the test area 12 form test terminals 13 similar to those shown in FIG. 2.

The connection wires 14 and 14' are isolated from each other by an insulative film 43 (CVD SiO$_2$) formed between them. Contact holes 44 are formed in the CVD SiO$_2$ film 43 above the vicinity of the lower connection wires 14'. The lower connection wires 14' may be used as electron beam test terminals in this condition. However in this figure, a conductive layer (Al) 13' is formed which makes contact through the contact holes 44 with the lower connection wirings 14'.

The conductive layer 13' forms an electron beam test terminal. Number 45 is a Si substrate, and 46 is a CVD SiO$_2$ film. Semiconductor devices may be formed at the surface of Si substrate of the test area 12.

According to this embodiment, into the test area 12, the test terminals 13 of the highest connection wires 14 and the test terminals 13' that connect lower connection wires 14' are both formed so that high terminal density is achieved. The burried conductive layer (terminal 13') is produced by sputter deposition and is effective to substantially even the surface level of the test terminals in the test area. This is useful to unify the test condition of the electric potential detection.

In the embodiment shown in FIG. 4a and FIG. 4b, the highest connection wires 14 and the corresponding test terminals 13 may be omitted. In such a case, it is possible to form only the openings 44 or one wide opening in the CVD SiO$_2$ film 43 and to use the exposed portions of the connection wires 14' as the test terminals instead of burring the conductive layers 13'.

Figure 5A:
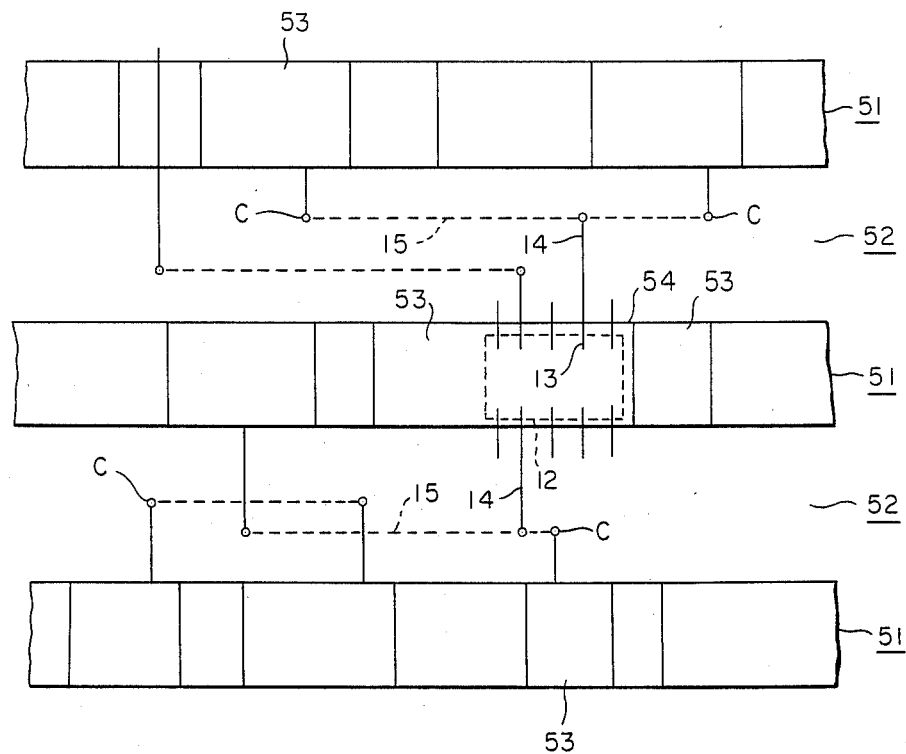
FIG. 5a and FIG. 5b are diagrams showing another embodiment in which the invention is applied to a semi-custom IC.
Figure 5B:
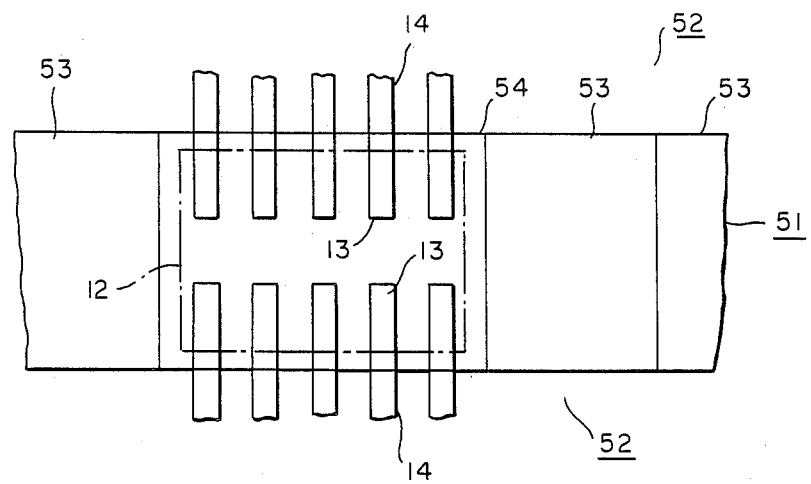

FIG. 5a is a diagram showing another embodiment of the invention. FIG. 5a shows a part of a semi-custom IC. FIG. 5b is a diagram showing an enlarged view of a test area of FIG. 5a.

At the surface of Si substrate, cell regions 51 and interconnection regions 52 are formed alternately as shown in FIG. 5a. Logic cells 53 are arranged as a line in each cell region. Many kinds of logic cells are stored in a cell library of a computer. Using these library cells, the position of each cell in the cell regions 51 and their interconnections are designed with CAD. This type of IC is called a standard cell semi-custom IC.

In the interconnection region 52 of FIG. 5a, vertical wires (solid lines) are made from the highest conductive layer; on the other hand, lateral wires (broken lines) are made from a lower conductive layer with the wires contacting each other at via contact holes C.

The highest conductive layer diverge or extend from a signal wires 15 and are gathered in the test area 12 to form test terminal 13 as shown in FIG. 5a and FIG. 5b. In FIG. 5a, only some connection wires 14 and signal wires are shown for the sake of simplicity.

Figure 6A:
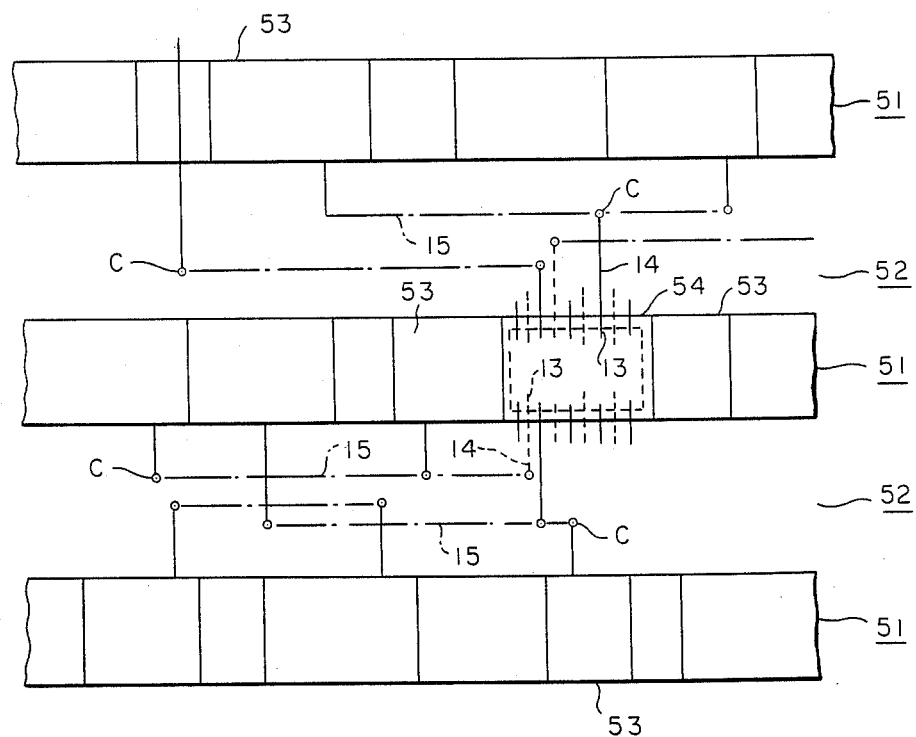
FIG. 6a and FIG. 6b are diagrams showing still another embodiment in which this invention is applied to a semi-custom IC.

FIG. 6a is a diagram showing another embodiment of the invention. FIG. 6a also shows a part of the standard cell semi-custom IC.

Figure 6B:
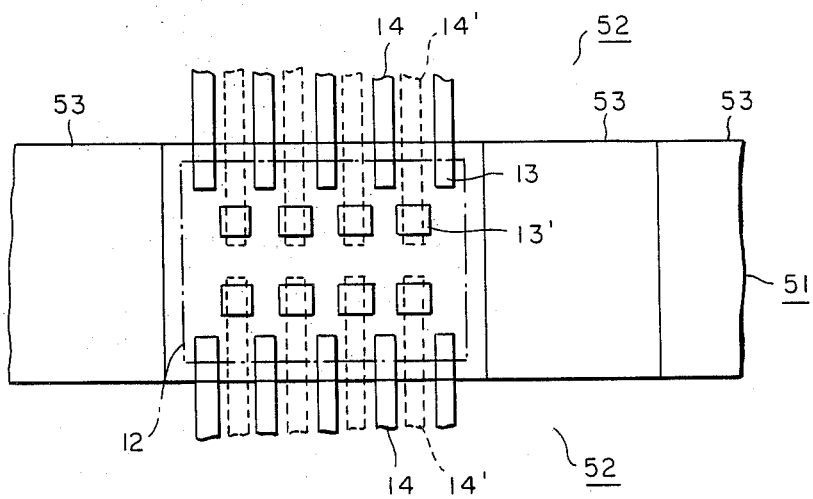

FIG. 6b is a diagram showing an enlarged view of a test area of FIG. 6a.

In FIG. 6a, the vertical wires (solid lines) are made from the highest conductive layer (for instance, a third Al layer), and lateral wires are made from the lower conductive layer (for instance, a first Al layer). Other vertical wires (broken line) made of middle conductive layer (for instance, a second Al layer) are added for increasing the number of test terminals.

That is, in FIG. 6b, connection wires 14' of a second Al layer are added. Test terminals 13' on the same level as the highest Al layer are attached to the connection wires 14' via through holes in the same manner as shown in FIG. 4a.

This invention is not restricted to the specific embodiments described above. For example, other conductive materials such as Mo, W or poly-Si with high concentration dopants may be used for test terminals and connection wirings instead of Al. Other modifications and improvements of the invention will also become apparent to these of skill in the art, and the invention is intended to cover such modifications and improvements as defined by the appeared claims.

What is claimed is:

1. A semiconductor integrated circuit device, comprising:
    (i) a semiconductor integrated circuit chip having a plurality of signal wires;
    (ii) a plurality of electron beam test terminals electrically connected to said signal wires, said electron beam test terminals being concentrated in at least one selected area of said semiconductor integrated circuit chip;
    (iii) first connecting wires being connected to ones of said signal wires and extending into said selected area;
    (vi) second connecting wires being connected to others of said signal wires, said second connecting wires having a level lower than that of said first connecting wires, extending into said selected area with a length longer than that of said first connecting wires, and being respectively positioned between said first connecting wires in said selected area;
    (v) an insulating layer disposed between said first and second connecting wires, said insulating layer having apertures at which tip portions of said second connecting wires are exposed; and
    (vi) conductive layers formed in the same plane and made from the same material as said first connecting wires, said conductive layers contacting said second connecting wires through said apertures and forming a first group of said electron beam test terminals, and portions of said first connecting wires in said selected area forming a second group of said electron beam test terminals.

2. A semiconductor integrated circuit device according to claim 1, wherein
    said electron beam test terminals are directed to said selected area from at least two opposite directions.

3. A semiconductor integrated circuit device according to claim 1, wherein
    said electron beam test terminals are directed to said selected area from four directions.

4. A semiconductor integrated device according to claim 1, wherein
    said selected area is rectangular in shape.

5. A semiconductor integrated circuit device according to claim 1, wherein
    said selected area is formed in a circuit area of said semiconductor integrated circuit chip.

6. A semiconductor integrated circuit device according to claim 1, further comprising:
    a test cell having said selected area thereon and inserted into a logic cell line on said chip, said electron beam test terminals being concentrated within said selected area from two opposite sides along said logic cell line.

7. A semiconductor integrated circuit device according to claim 1, wherein said first connecting wires and conductive layers are made from Al.

8. A semiconductor integrated circuit device, comprising:
    (i) a semiconductor integrated circuit chip having a plurality of signal wires;
    (ii) a plurality of electron beam test terminals electrically connected to said signal wires, said electron beam test terminals being concentrated in at least one selected area of said semiconductor integrated circuit chip and said selected area being rectangular in shape;
    (iii) first connecting wires being connected to one of said signal wires and extending into said selected area;
    (iv) second connecting wires being connected to others of said signal wires, said second connecting wires having a level lower than that of said first connecting wires, extending into said selected area with a longer length than that of said first connecting wires in said selected area;
    (v) an insulating layer disposed between said first and second connecting wires, said insulating layer having apertures at which tip portions of said second connecting wires are exposed; and
    (vi) conductive layers formed in a same plane and made from a same material as said first connecting wires, said conductive layers contacting said second connecting wires through said apertures and forming a first group of said electron beam test terminals, and portions of said first connecting wires in said selected area forming a second group of said electron beam test terminals,
    wherein said first and second connecting wires are both extended into said selected area from at least the same two opposite sides, and said first group of said electron beam test terminals being arranged in a matrix form in a region where said electron beam test terminals of said second group from said opposite two sides being configured to face each other.

9. A semiconductor integrated circuit device according to claim 8, wherein said selected area is formed in a circuit area of said semiconductor integrated circuit chip.

10. A semiconductor integrated circuit device according to claim 8, wherein said first connecting wires and conductive layers are made from aluminum.

11. A semiconductor integrated circuit device according to claim 8, further comprising:
    a test cell having said selected area thereon and inserted into a logic cell line on said chip, said test terminals being concentrated within said selected area from two opposite sides along said logic cell line.

12. A semiconductor integrated circuit device, comprising:
    (i) a semiconductor integrated circuit chip having a plurality of signal wires;
    (ii) a plurality of electron beam test terminals electrically connected to said signal wires, said electron beam test terminals being concentrated in at least one selected area of said semiconductor integrated circuit chip and said selected area having four different sides;
    (iii) first connecting wires being connected to one of said signal wires and extending into said selected area;

(iv) second connecting wires being connected to others of said signal wires, said second connecting wires having a level lower than that of said first connecting wires, and extending into said selected area with a longer length than that of said first connecting wires in said selected area;

(v) an insulating layer disposed between said first and second connecting wires, said insulating layer having apertures at which tip portions of said second connecting wires are exposed; and (vi) conductive layers formed in a same plane and made from a same material as said first connecting wires, said conductive layers contacting said second connecting wires through said apertures and forming a first group of said electron beam test terminals, and portions of said first connecting wires in said selected area forming a second group of said electron beam test terminals, wherein said first and second connecting wires are both extended into said selected area from at least the same two opposite sides, and said first group of said electron beam test terminals being arranged in parallel lines, in a region where said electron beam test terminals of said second group extended from said opposite two sides and being configured to face each other.

13. A semiconductor integrated circuit device according to claim 12, wherein said selected area is formed in a circuit area of said semiconductor integrated circuit chip.

14. A semiconductor integrated circuit device according to claim 12, wherein said first connecting wires and conductive wires are made from aluminum.

15. A semiconductor integrated circuit device according to claim 12, further comprising:

a test cell having said selected area thereon and inserted into a logic cell line on said chip, said test terminals being concentrated within said selected area from two opposite sides along said logic cell line.

* * * * *